United States Patent
Varricchione

(10) Patent No.: US 7,173,501 B1
(45) Date of Patent: Feb. 6, 2007

(54) DUAL SLOPE TEMPERATURE DEPENDENT OSCILLATOR

(75) Inventor: Jason Varricchione, Williston, VT (US)

(73) Assignee: Cypress Semiconductor Corporation, San Jose, CA (US)

( * ) Notice: Subject to any disclaimer, the term of this patent is extended or adjusted under 35 U.S.C. 154(b) by 31 days.

(21) Appl. No.: 10/845,661

(22) Filed: May 14, 2004

Related U.S. Application Data

(60) Provisional application No. 60/483,417, filed on Jun. 27, 2003.

(51) Int. Cl.
*H03L 1/00* (2006.01)
(52) U.S. Cl. .............. 331/176; 331/66; 327/83
(58) Field of Classification Search ................. 331/176, 331/66; 327/83
See application file for complete search history.

(56) References Cited

U.S. PATENT DOCUMENTS

| | | | |
|---|---|---|---|
| 3,978,431 A | 8/1976 | Lattin | |
| 3,987,371 A | 10/1976 | Feindt | |
| 4,380,745 A | 4/1983 | Barlow et al. | |
| 5,604,467 A * | 2/1997 | Matthews | 331/176 |
| 6,020,792 A * | 2/2000 | Nolan et al. | 331/111 |
| 6,275,117 B1 | 8/2001 | Abugharbieh et al. | |
| 6,294,962 B1 | 9/2001 | Mar | |
| 6,304,148 B1 | 10/2001 | Nomura et al. | |
| 6,680,656 B2 * | 1/2004 | Chen | 331/143 |

* cited by examiner

*Primary Examiner*—Joseph Chang
(74) *Attorney, Agent, or Firm*—Bradley T. Sako

(57) ABSTRACT

An oscillator circuit (100) can provide a dual slop temperature response. For a lower temperature range, a capacitor (106) can be charged and/or discharged according to a first current source (302) that provides an essentially constant current source. For a higher temperature range, the capacitor (106) can be charged and/or discharged according to a second current source (304) that can be enabled and/or provide current according to a voltage proportional to absolute temperature. A slightly positive temperature coefficient of a first current source (302) can be offset by a threshold detect circuit (210 and 212) within a second comparator circuit (204) that utilizes the threshold voltage (Vt) of a transistor (212) as a low limit for a capacitor voltage.

20 Claims, 3 Drawing Sheets

DUAL SLOPE TEMPERATURE DEPENDENT OSCILLATOR

This application claims the benefit of U.S. Provisional Patent Application Ser. No. 60/483,417 filed on Jun. 27, 2003.

TECHNICAL FIELD

The present invention relates generally to oscillator circuits, and more particularly to an oscillator that can provide a frequency that varies differently over more than one temperature range.

BACKGROUND OF THE INVENTION

Various conventional oscillator structures are known.

As a first example, conventional ring oscillators are known that can include a ring of logic circuit elements.

As a second example, conventional oscillator circuits are known that can include a capacitor that is charged or discharged in conjunction with dual differential amplifiers. One differential amplifier can detect a high threshold level for the capacitor and charge down (discharge) the capacitor when the threshold is exceeded. Conversely, the other differential amplifier can detect a low threshold level for the capacitor and can charge up the capacitor when the capacitor voltage falls below this threshold.

While conventional dual differential amplifier approaches can provide an adequate periodic signal source, such approaches can have drawbacks. As is well known, differential amplifier circuits can include a common mode range. Consequently, when two such circuits are employed in an oscillator circuit, such common mode ranges can limit allowable voltage swings on the capacitor. This can present unwanted design/operational constraints on the oscillator circuit.

Conventional oscillator circuits, like those noted above, can have a temperature dependence that is native to the material in which the circuits are formed. Further, conventional approaches have tended to seek a linear, or essentially constant relationship between temperature and oscillating frequency. However, in some applications, such a single temperature coefficient over an entire temperature range may not be sufficient. As but one example, as is well known, dynamic random access memory (DRAM) cells must be periodically refreshed to maintain data values on storage capacitors. However, the rate at which charge can leak from DRAM cells may not vary linearly over temperature. Consequently, timing the refresh of such cells with conventional oscillator circuits may only address leakage rates in a narrow temperature range.

In light of the above, it would be desirable to arrive at an oscillator circuit that can have different responses over different temperature ranges.

In addition, due to the continuing goal of providing integrated circuits that operate at lower power supply voltages, it would be desirable if such an oscillator circuit can operate with a relatively low power supply voltage.

SUMMARY OF THE INVENTION

The present invention can include an oscillator circuit that includes a first threshold detect circuit coupled to a capacitor that generates a first detect signal when a voltage on the capacitor exceeds a first limit. A second threshold detect circuit can be coupled to the capacitor and can generate a second detect signal when a voltage on the capacitor exceeds a second limit. The oscillator circuit can also include a current source circuit coupled to the capacitor. The current source circuit can include a first current source that provides a relatively constant current over at least a first temperature range, and a second current source that provides a current over a second temperature range and not the first temperature range.

Such a dual temperature range is in contrast to conventional oscillator circuits that may seek to charge a capacitor at essentially the same rate over all temperature ranges.

According to one aspect of the embodiments, a first threshold detect circuit can include a differential amplifier.

According to another aspect of the embodiments, a second threshold detect circuit can include an insulated gate field effect transistor (IGFET) threshold voltage (Vt) detect circuit.

An IGFET threshold voltage (Vt) detect circuit may detect when a voltage falls below (or rises above) the threshold voltage of a transistor. Such an arrangement can eliminate the need for dual differential amplifiers, and hence eliminate dual common mode voltage constraints on a capacitor voltage range.

According to another aspect of the embodiments, a second threshold detect circuit includes an IGFET with a gate coupled to the capacitor. The threshold voltage of the IGFET can set the second limit for the capacitor voltage.

According to another aspect of the embodiments, a first current source can provide a current according to a positive temperature coefficient. A second threshold detect circuit can generate the first detect signal according to a negative temperature coefficient. Such different temperature coefficients can offset one another to provide a more constant oscillator period over temperature range.

According to another aspect of the embodiments, a first temperature range is lower than the second temperature range.

According to another aspect of the embodiments, a second current source can provide current in response to a voltage proportional to absolute temperature (VPTAT).

According to another aspect of the embodiments, a second current source can include an IGFET having a gate coupled to the VPTAT.

The present invention may also include an oscillator circuit with a charge storage node, a first compare circuit, and a second compare circuit. A first circuit can include a differential amplifier that compares a reference voltage to the charge storage node voltage to generate a first detect indication. The second compare circuit can include an IGFET that compares a threshold voltage of the IGFET to the charge storage voltage node to generate a second detect indication.

As noted above, utilizing second compare circuit that compares to an IGFET threshold voltage (Vt) can eliminate dual common mode voltage constraints present in conventional designs with dual differential amplifiers. Still further, such an arrangement can allow for lower operating voltages for the oscillator circuit.

According to one aspect of the embodiments, a reference voltage can be a bandgap reference voltage. The first detect indication can be generated when the charge storage node voltage exceeds the bandgap reference voltage.

According to another aspect of the embodiments, an IGFET of a second compare circuit can be an n-channel IGFET. A second detect indication can be generated when the charge storage node voltage falls below the threshold voltage of the n-channel IGFET.

According to another aspect of the embodiments, a second compare circuit can include a gate of the IGFET coupled to the charge storage node, and a compare current source coupled between a drain of the IGFET and a first power supply.

According to another aspect of the embodiments, an oscillator circuit can also include a capacitor having a terminal coupled to the charge storage node, and a capacitor current source circuit coupled to the charge storage node.

According to another aspect of the embodiments, a capacitor current source circuit provides current according to a first temperature coefficient for a first temperature range and according to a second temperature coefficient for a second temperature range.

According to another aspect of the embodiments, a capacitor current source circuit includes a first current source that supplies current according to a current reference potential based on a bandgap reference voltage, and a second current source that supplies current according a voltage proportional to absolute temperature (VPTAT).

According to another aspect of the embodiments, a first current source can include a first current source IGFET with a gate coupled to the current reference potential. The second current source can include a second current source IGFET with a gate coupled to a VPTAT and a resistor in series with the source-drain path of the second current source IGFET.

The present invention may also include a method of generating a periodic signal. The method can include the steps of: controlling current for a capacitor according to first current source over a first temperature range; controlling current for the capacitor according to a second current source different than the first current source over the second temperature range; and generating the period signal in response to the charging and discharging of the capacitor.

According to one aspect of the embodiments, the step of controlling the current for a capacitor according the first current source can include generating current according to a bandgap reference voltage to provide a small decrease in current as temperature decreases. In addition, the step can include offsetting such a decrease in current by generating one type of transition of the periodic signal (e.g., a falling or rising transition) according to a comparison with a transistor threshold voltage.

According to another aspect of the embodiments, the step of controlling current for the capacitor according to the second current source includes enabling an insulated gate field effect transistor according to a voltage proportional to absolute temperature.

According to another aspect of the embodiments, the method can further include refreshing dynamic random access memory cells at a rate that corresponds to the periodic signal.

DETAILED DESCRIPTION

According to embodiments of the present invention, an oscillator circuit can provide a frequency versus temperature response that varies in slope across two temperature regions. The oscillator circuit may also be well suited for low current and/or low power supply voltage applications.

Figure 1:
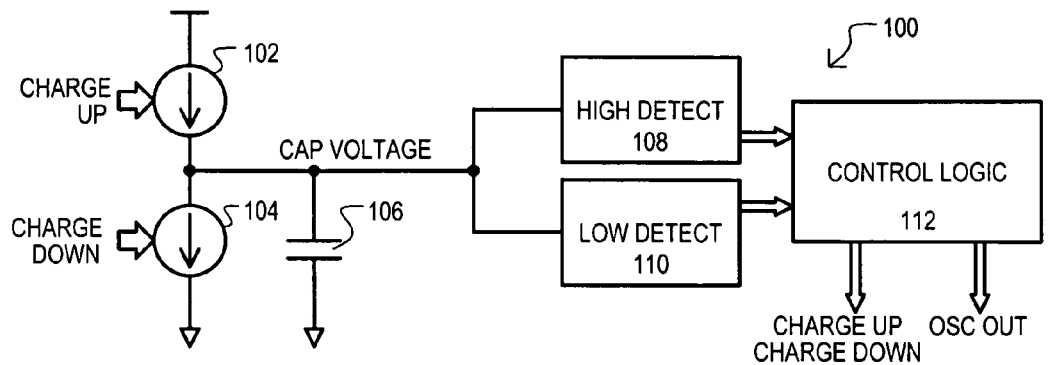
FIG. 1 is a block schematic diagram of an oscillator circuit according to one embodiment of the present invention.

An oscillator circuit according to one embodiment of the present invention is set forth in FIG. 1, and designated by the general reference character 100. An oscillator circuit 100 can include a charge up current source 102, a charge down current source 104, a capacitor 106, a first comparator circuit 108, a second comparator circuit 110, and control logic 112.

A charge up current source 102 can charge a capacitor 106 according to a charge up signal CHARGE UP. A charge down current source 104 can charge down (i.e., discharge) a capacitor 106 according to a charge down signal CHARGE DOWN. A capacitor 106 can be selected to provide a desired oscillation frequency range according to well understood techniques.

A first comparator circuit 108 can determine when a voltage on the capacitor 106 exceeds a predetermined high threshold limit. A second comparator circuit 110 can determine when a voltage on the capacitor 106 falls below a predetermined low threshold limit. First and second comparator circuits (108 and 110) can provide output signals to control logic 112.

In response to outputs from first and second comparator circuits (108 and 110), control logic 112 can provide an oscillator output signal OSC OUT as well as CHARGE UP and CHARGE DOWN signals. It is understood that an oscillator output signal OSC OUT can be a frequency divided version of an oscillating signal on the capacitor 106.

Conventionally, first and second comparator circuits can each include a differential amplifier, and hence have the same basic structure.

In contrast to this, embodiments of the present invention can employ a second comparator circuit that differs from a first comparator circuit. In particular, a second comparator circuit 110 may operate according to a transistor threshold voltage instead of a generated reference voltage. In such an arrangement, an allowable voltage range swing for a capacitor 106 may not be limited by the common mode range of two differential amplifiers. One particular arrangement for such an approach will be explained in more detail below.

Figure 2:
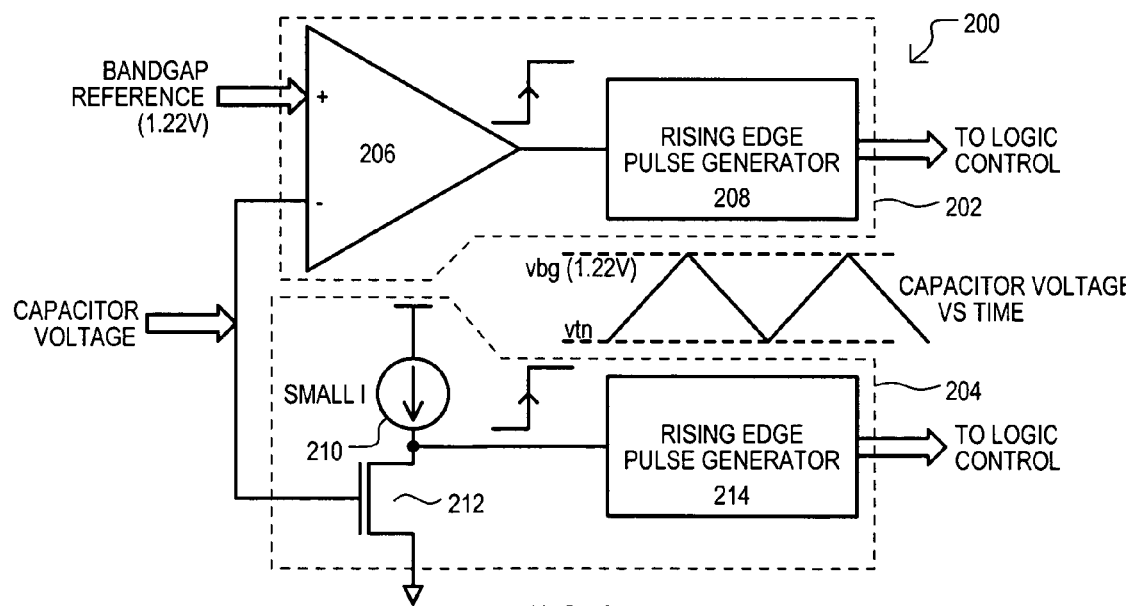
FIG. 2 shows a block schematic diagram of a comparator circuit and a capacitor voltage timing diagram according to an embodiment of the present invention.

Referring now to FIG. 2, one example of a possible comparator circuit arrangement is set forth in FIG. 2, and designated by the general reference character 200. The circuit of FIG. 2 includes a first comparator circuit 202 (which can correspond to first comparator circuit 108 of FIG. 1) and a second comparator circuit 204 (which can correspond to second comparator circuit 110 of FIG. 1). A first comparator circuit 202 can include a differential amplifier 206 and a first edge detect circuit 208. A differential amplifier 206 can include a first input "+" that receives a reference voltage, a second input "−" that can receive a capacitor voltage, and an output coupled to first edge detect circuit 208.

A reference voltage supplied to differential amplifier 206 can be a voltage produced by a constant voltage generation technique. Preferably, such a voltage can be a "bandgap" reference voltage (e.g., about 1.22 V). As is well understood in the art, a "bandgap" reference voltage can be a reference voltage having a limited temperature coefficient. In particular, a bandgap reference voltage can utilize the positive temperature coefficient of a threshold voltage (Vt) to offset a negative temperature coefficient of a base-emitter voltage of a bipolar transistor ($V_{BE}$). Bandgap reference voltage circuits are well understood in the art, and so will not be discussed any further herein.

The reference voltage for differential amplifier 206 can serve as a high threshold voltage. That is, once a capacitor voltage exceeds the reference voltage, an output of differential amplifier 206 can transition from one value (e.g., low) to another value (e.g., high).

A first edge detect circuit 208 can generate an output value according to a predetermined transition in an output signal from differential amplifier 206. In the particular example of FIG. 2, a first edge detect circuit 208 can be a rising edge pulse generator. A rising edge pulse generator can generate an output pulse in response to a low-to-high transition in the output of the differential amplifier 206. Edge detect circuits are well understood in the art and so will not be described in detail. As but one of the many possible examples, and edge detect circuit can include a logic gate with one input having a delay path/circuit.

A second comparator circuit 204 can include a threshold detect circuit (210 and 212) and a second edge detect circuit 214. Thus, unlike conventional approaches, the present invention can utilize a threshold detect circuit (210 and 212) as a second comparator circuit 204. Such an arrangement can present only one common mode range limitation, thus a voltage range for a capacitor (e.g., 106) can be larger than conventional cases.

A threshold detect circuit according to FIG. 2 can include a current source 210 and an n-channel transistor 212. A current source 210 can be connected between a drain of transistor 212 and a high power supply voltage. Transistor 212 can have a gate that receives a capacitor voltage and a source connected to a lower power supply.

The threshold voltage (Vtn) for transistor 212 can serve as a low threshold voltage for a comparator. That is, once a capacitor voltage falls below the threshold voltage (Vtn) transistor 212 can be turned off. As a result, a drain of transistor 212 can transition from one value (e.g., low) to another value (e.g., high).

It is noted that utilizing a threshold voltage (Vtn) as set forth in FIG. 2 can eliminate a second common mode range that would occur in dual differential amplifier approaches. In addition, this can allow for lower operating voltages.

A second edge detect circuit 214 can generate an output value according to a predetermined transition in an output signal from threshold detect circuit (210 and 212) (i.e., the signal generated at the drain of transistor 212). In the particular example of FIG. 2, a second edge detect circuit 214 can be a rising edge pulse generator. A rising edge pulse generator can generate an output pulse in response to a low-to-high transition in the output of threshold detect circuit (210 and 212).

Outputs from first and second edge detect circuits (208 and 214) can be provided to control logic (e.g., 112). Control logic 112 can charge/discharge a capacitor 106 according to such outputs. Such an arrangement is illustrated in graphical form in FIG. 2. As shown, once a capacitor voltage exceeds the high threshold reference voltage (in the case the 1.22 V bandgap reference voltage (vbg)), the control logic 112 can generate a CHARGE DOWN command, resulting in the capacitor discharging. Conversely, once a capacitor voltage falls below the low threshold reference voltage (in the case the n-channel threshold voltage vtn), the control logic 112 can generate a CHARGE UP command, resulting in the capacitor charging.

In this way, the voltage on a capacitor (e.g., 106) can oscillate, thus providing a periodic signal.

Unlike conventional approaches that seek to provide a same response over all temperature ranges, the embodiments of the present invention can provide different responses over different temperature ranges. To obtain such a novel temperature response, the present invention can utilize two different types of current sources to charge and discharge an oscillating capacitor. One example of such a novel current source circuit is set forth in FIG. 3, and designated by the general reference character 300.

A current source circuit 300 can include two different current sources arranged in parallel. A first current source 302 can correspond to a relatively low temperature behavior (e.g., below about 25° C.) where a relatively flat oscillator period response is desirable. Such a current source can be a conventional current source circuit that provides a current in response to a bandgap current source voltage VNBIAS. Thus, first current source 302 can provide a stable current that decreases in relatively small amounts as temperature goes down. It is understood that a decrease in a capacitor current supply can correspond to an increase in oscillating frequency, as more time is required to charge/discharge the capacitor.

The temperature response presented by a first current source 302 can be offset by the threshold detect circuit (210/212). In particular, as temperature goes down, a threshold voltage (vtn) of transistor 212 can go up. This can correspond to a decrease in oscillating frequency, as the lower threshold voltage limit will be triggered sooner.

Figure 3:
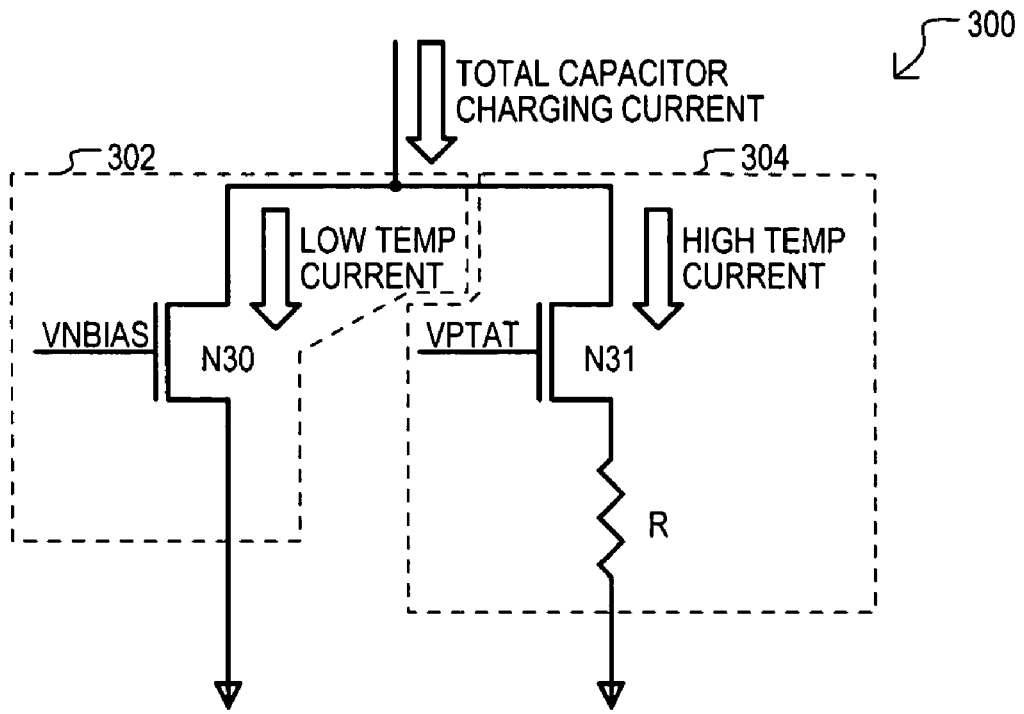
FIG. 3 is a schematic diagram of a current source circuit according to an embodiment of the present invention.

As shown in the particular example of FIG. 3, a first current source 302 can include an n-channel transistor N30 that receives the bandgap current source voltage VNBIAS at its gate.

The above advantageous offsetting effects can result in an overall relatively small temperature coefficient. As but one very particular example, such a lower temperature coefficient can be in the range of about 5% per 10° C.

A second current source 304 can correspond to relatively high temperatures (e.g., above about 25° C.). Such a current source 304 can provide a current in response to a voltage that is proportional to absolute temperature (VPTAT). In particular, the VPTAT voltage can rise according to temperature in order to enable second current source 304 at about 25° C.

Circuits for generating a VPTAT are well understood in the art, and can include, but are certainly not limited to, thermal voltage references self-biased circuits.

Even more particularly, a second current source 304 can include an n-channel transistor N31 with a gate that receives the VPTAT voltage and a source connected to a source degeneration resistor R. The voltage VPTAT can rise with temperature to turn on transistor N31 at about 25° C. As temperature rises past about 25° C. the voltage VPTAT can continue to rise, and more current can be provided by transistor N31. Source degeneration resistor R can serve to provide a more linear current relationship to the voltage VPTAT (rather than exponential). As a result, second current source 304 can tend to increase capacitor oscillating frequency as temperature increases.

The above higher temperature response can result in an overall higher temperature coefficient. As but one very particular example, such a higher temperature coefficient can be in the range of about 58.6% per 10° C.

Figure 4:
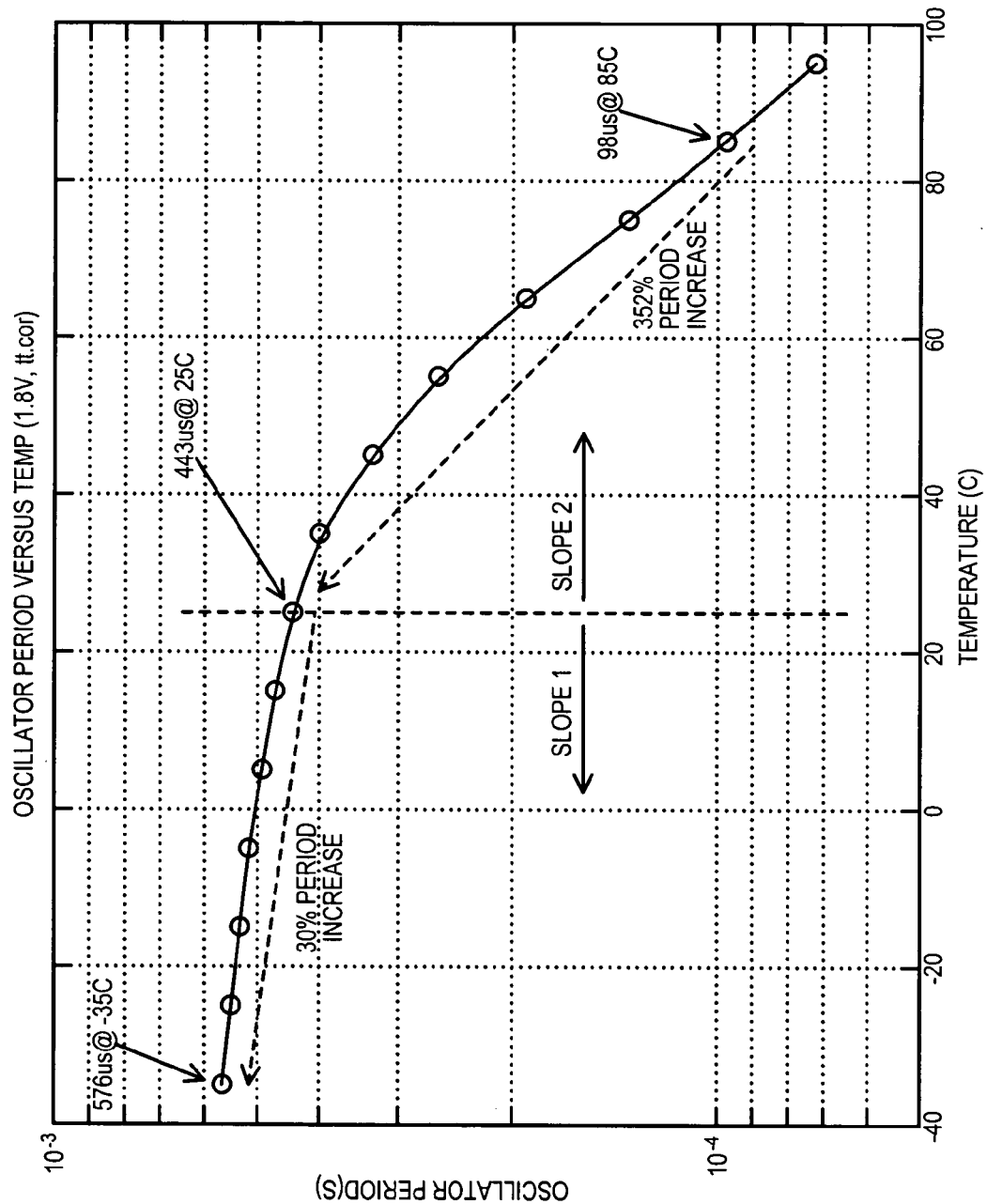
FIG. 4 is a graph showing the relationship between temperature and oscillator period according to one embodiment of the present invention.

Referring now to FIG. 4, a graph is set forth illustrating a resulting oscillator period versus temperature result according to embodiments of the present invention. As shown in the figures, the present invention can provide a "dual slope" response. In particular, the oscillator can respond according to a SLOPE 1 at temperatures less than about 25° C. However, at temperatures above about 25° C., the oscillator can respond according to a SLOPE 2, which is clearly different than SLOPE 1.

The response of FIG. 4 is in sharp contrast to conventional arrangements that seek to provide either a single (or no) slope response.

In this way, the present invention can provide an oscillator circuit with a dual slope temperature dependence. Further, such an oscillator circuit can operate at lower supply voltages.

Figure 5:
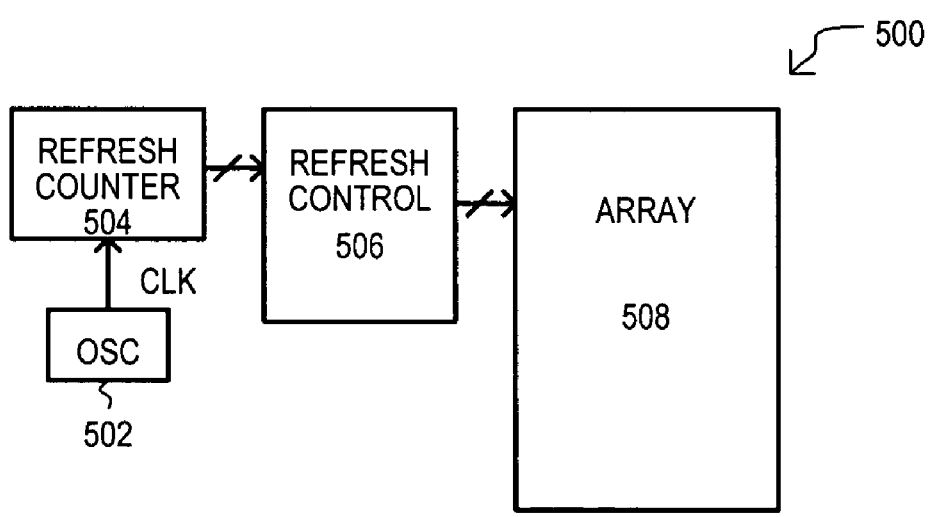
FIG. 5 is a block diagram of a memory device having a refresh timing arrangement according to an embodiment of the present invention.

FIG. 5 shows one particular application of an oscillator circuit according to one embodiment of the present invention. FIG. 5 shows a memory device 500 that includes an oscillator circuit 502, a refresh counter 504, a refresh control circuit 506, and a memory cell array 508.

A memory device 500 can include "dynamic" memory cells that require a refresh operation to maintain data states. As but two possible examples, a memory device 500 can be a dynamic random access memory (DRAM) or a "pseudo" static RAM (PSRAM).

An oscillator circuit 502 can include an oscillator circuit like that described above, and can provide a clock signal CLK to a refresh counter 504. Thus, such a clock signal can have the advantageous temperature correspondence as described above.

A refresh counter 504 can be a conventional counter circuit that can enable a refresh operation according a predetermined number of clock signals. That is, after a predetermined number of CLK signals, a refresh counter 504 can direct refresh control circuit 506 to perform a refresh operation. Thus, refresh operations can occur with a periodicity having the advantageous dual slope temperature response described above.

A refresh control circuit 506 can be a conventional refresh control circuit that can refresh a number of memory cells according to a predetermined pattern. As but one very particular example, a refresh control circuit 506 can execute refresh operations on a row-by-row basis in the background of normal memory cell access operations.

A memory cell array 508 can be a conventional memory array circuit that includes a number of refreshable memory cells and corresponding access circuitry (e.g., row/column decoders, sense amplifiers, column decoders, etc.).

Of course, the application set forth in FIG. 5 is but one particularly advantageous application of an oscillator circuit of the present invention, and so should not be considered limiting to the invention. There can be many other advantageous applications for distinctly different oscillating responses over different temperature ranges other than the refresh of DRAM cells.

It is understood that the embodiments of the invention may be practiced in the absence of an element and or step not specifically disclosed. That is, an inventive feature of the invention can be elimination of an element or step.

Accordingly, while the various aspects of the particular embodiments set forth herein have been described in detail, the present invention could be subject to various changes, substitutions, and alterations without departing from the spirit and scope of the invention.

What is claimed is:

1. An oscillator circuit, comprising:
   a first threshold detect circuit coupled to a capacitor that generates a first detect signal when a voltage on the capacitor exceeds a first limit;
   a second threshold detect circuit coupled to the capacitor that generates a second detect signal when the voltage on the capacitor exceeds a second limit; and
   a current source circuit coupled to the capacitor having
      a first current source that provides a relatively constant current over at least a first temperature range, and
      a second current source that provides a current over a second temperature range and essentially no current over the first temperature range.

2. The oscillator circuit of claim 1, wherein;
   the first threshold detect circuit includes a differential amplifier.

3. The oscillator circuit of claim 1, wherein:
   the second threshold detect circuit includes an insulated gate field effect transistor (IGFET) threshold voltage (Vt) detect circuit, that generates the second detect signal when the voltage on the capacitor exceeds Vt.

4. The oscillator circuit of claim 3, wherein:
   the second threshold detect circuit includes an IGFET, with the threshold voltage (Vt), and having a gate coupled to the capacitor.

5. The oscillator circuit of claim 1, wherein:
   the first current source provides a current that varies according to a positive temperature coefficient; and
   the second threshold detect circuit generates the first detect signal according to a threshold limit that varies according to a negative temperature coefficient.

6. The oscillator circuit of claim 1, wherein:
   the first temperature range is lower than the second temperature range.

7. The oscillator circuit of claim 1, wherein:
   to the second current source provides current in response to a voltage proportional to absolute temperature (VPTAT).

8. The oscillator circuit of claim 7, wherein:
   the second current source includes an IGFET having a gate coupled to the VPTAT.

9. An oscillator circuit, comprising:
   a charge storage node;
   a first compare circuit including a differential amplifier that compares a reference voltage to the charge storage node voltage to generate a first detect indication; and
   a second compare circuit that compares a threshold voltage (Vt) of an insulated gate field effect transistor (IGFET) to the charge storage voltage node to generate a second detect indication.

10. The oscillator circuit of claim 9, wherein:
    the reference voltage is bandgap reference voltage, and the first detect indication is generated when the charge storage node voltage exceeds the bandgap reference voltage.

11. The oscillator circuit of claim 9, wherein:
    the IGFET is an n-channel IGFET, and the second detect indication is generated when the charge storage node voltage falls below the threshold voltage of the n-channel IGFET.

12. The oscillator circuit of claim 9, wherein:
    the second compare circuit includes
       a gate of the IGFET coupled to the charge storage node, and
       a compare current source coupled between a drain of the IGFET and a first power supply.

13. The oscillator circuit of claim 9, further including:

a capacitor having a terminal coupled to the charge storage node; and a capacitor current source circuit coupled to the charge storage node.

14. The oscillator circuit of claim 13, wherein:

the capacitor current source circuit provides current according to a first temperature coefficient for a first temperature range and according to a second temperature coefficient, different than the first temperature coefficient, for a second temperature range.

15. The oscillator circuit of claim 13, wherein:

the capacitor current source circuit includes a first current source that supplies current according to a current reference potential based on a bandgap reference voltage, and a second current source that supplies current according a voltage proportional to absolute temperature (VPTAT).

16. The oscillator circuit of claim 15, wherein:

the first current source includes a first current source IGFET with a gate coupled to the current reference potential, and the second current source includes a second current source IGFET with a gate coupled to the VPTAT and a resistor in series with the source-drain path of the second current source IGFET.

17. A method of generating a periodic signal, comprising the steps of:

controlling current for a capacitor according to a first temperature coefficient over a first temperature range;

controlling current for the capacitor according to a second temperature coefficient over a second temperature range; and generating the period signal in response to the charging and discharging of the capacitor.

18. The method of claim 17, wherein:

the step of controlling the current for a capacitor according first temperature coefficient includes generating current according to a bandgap reference voltage to provide a small decrease in current as temperature decreases, and offsetting such decrease in current by generating one transition of the periodic signal according to a comparison with a transistor threshold voltage.

19. The method of claim 17, wherein:

the step of controlling current for the capacitor according to the second temperature coefficient includes enabling an insulated gate field effect transistor according to a voltage proportional to absolute temperature.

20. The method of claim 17, further including:

refreshing dynamic random access memory cells at a rate that corresponds to the periodic signal.

\* \* \* \* \*